United States Patent [19]
Bylund et al.
[11] 3,739,234
[45] June 12, 1973

[54] SEMICONDUCTOR DEVICE HAVING HEAT PIPE COOLING MEANS

[75] Inventors: Per Åke Bylund; Gunnar Mellgren, both of Vasteras, Sweden

[73] Assignee: Allmanna Svenska Elektriska Aktiebolaget, Vasteras, Sweden

[22] Filed: Jan. 28, 1971

[21] Appl. No.: 110,721

[30] Foreign Application Priority Data
Feb. 24, 1970 Sweden .............................. 2336/70

[52] U.S. Cl. .......... 317/234 R, 317/234 B, 174/15, 165/80, 165/105, 62/119
[51] Int. Cl. .......................... H01l 3/00, H01l 5/00
[58] Field of Search ...................... 317/234, 1, 1.5; 165/80, 105; 62/119, 56, 435; 174/15

[56] References Cited

UNITED STATES PATENTS

| | | | |
|---|---|---|---|
| 3,143,592 | 8/1964 | August | 62/119 |
| 3,209,062 | 9/1965 | Scholz | 165/105 X |
| 3,417,575 | 12/1968 | Stark | 62/119 |
| 2,754,455 | 7/1956 | Pankove | 317/234 A |
| 2,815,473 | 12/1957 | Ketteringham et al. | 317/234 B |
| 2,933,662 | 4/1960 | Boyer et al. | 317/234 B |
| 2,933,663 | 4/1960 | Connell | 317/234 B |

FOREIGN PATENTS OR APPLICATIONS

| | | | |
|---|---|---|---|
| 851,047 | 10/1960 | Great Britain | 317/234 B |

OTHER PUBLICATIONS

The Heat Pipe; by T. Feldman et al., Mechanical Engineering February 1967 pages 30 to 33.

*Primary Examiner*—John W. Huckert
*Assistant Examiner*—Andrew J. James
*Attorney*—Jennings Bailey, Jr.

[57] ABSTRACT

A semiconductor device has a semiconductor element arranged for double-sided cooling. At least one heat pipe is provided having one or more bends therein, one end of the heat pipe being in contact with the semiconductor element and the other end being in heat exchange relation with a heat exchanger provided with cooling flanges.

5 Claims, 3 Drawing Figures

Patented June 12, 1973 3,739,234

2 Sheets-Sheet 1

INVENTOR.
PER AKE BYLUND
BY GUNNAR MELLGREN
Jennings Bailey, Jr.

SEMICONDUCTOR DEVICE HAVING HEAT PIPE COOLING MEANS

BACKGROUND OF THE INVENTION

1. Field of the Invention

The present invention relates to a semiconductor device comprising a semiconductor element for double-sided cooling, such as a diode or a thyristor, and a first heat-exchanger applied in thermal connection with the semiconductor element in order to emit heat to a coolant which is in contact with the heat-exchanger.

2. The Prior Art

Semiconductor devices of this type are well known, for example from British patent No. 1,099,874 in which FIG. 1 shows two cooling bodies (13, 14) provided with flanges applied in direct electrical and thermal contact with opposite sides of a semiconductor element (1 – 11). As can be seen from the figure, the distance between parts having different electric potential is relatively small, both directly between the cooling bodies and along the surface of the insulating rings 6, 7. This means that, if the device becomes extremely dirty or wet, spark-over may occur. Semiconductor elements with cooling bodies are normally placed in cooling air shafts or drums. If the cooling air is normally clean no problems generally arise. However, with certain types of equipment, particularly those for vehicles, it has been found that the cooling air often contains so much dust, iron particles from brake blocks, carbon particles from current collectors, etc. that there may be disturbances in operation. The problem is particularly accentuated in winter when, under certain conditions, considerable quantities of snow accompany the cooling air.

Since it is of great importance that the temperature drop in the cooling body between the semiconductor element and the cooling air is as little as possible, it has been found practically impossible to increase noticeably creep distances and insulation distances by, for example, making the parts 17, 18 of the cooling bodies in the above-mentioned patent considerably higher.

SUMMARY OF THE INVENTION

The result of the present invention is a device which completely eliminates these disadvantages without adversely affecting the cooling effect, and thus the loadability of the semiconductor elements. A device according to the invention is characterized in that the semiconductor element is positioned in a space separated from the coolant and that a first heat pipe is provided with one end in thermal contact with the semiconductor element and the other end in thermal contact with the heat-exchanger.

BRIEF DESCRIPTION OF THE DRAWING

The invention will be further described with reference to the accompanying drawings in which.

DESCRIPTION OF THE PREFERRED EMBODIMENTS

The function of a heat pipe is described in U.S. Pat. specification No. 2,350,348 and it is known that a heat pipe with low temperature drop can transmit a large heat flux.

Figure 1:
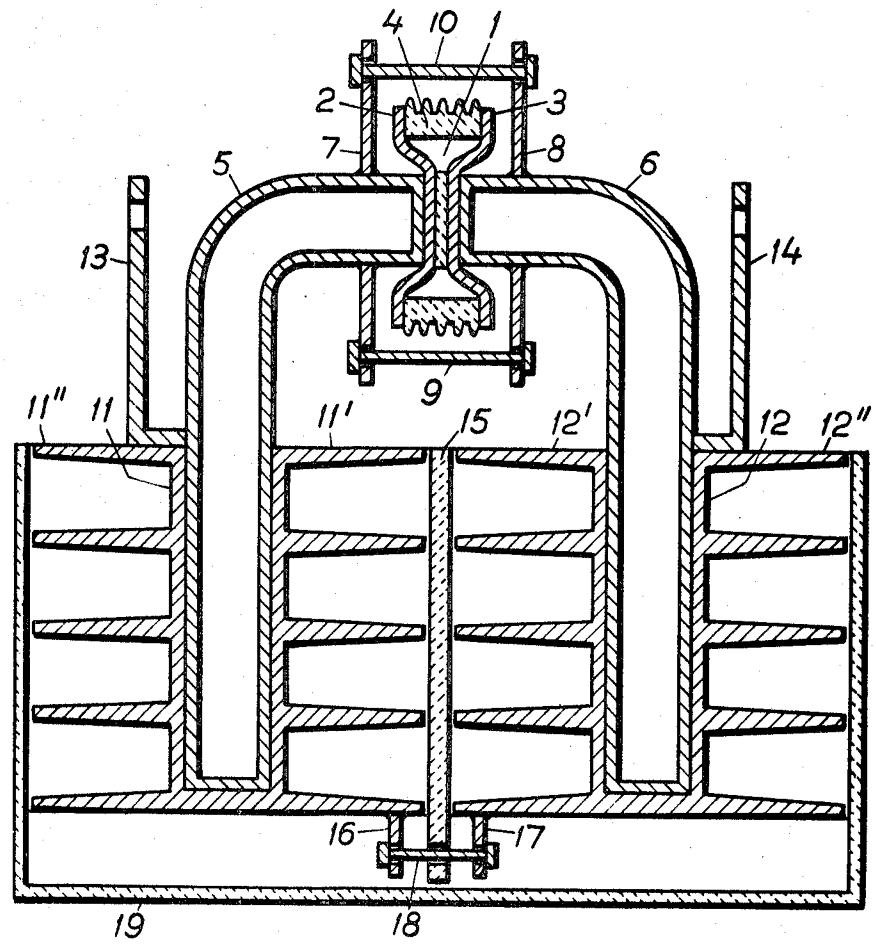
FIG. 1 shows a device having two heat pipes and two cooling bodies per semiconductor element and FIG. 2 shows an embodiment having a cooling body for one semiconductor element or common to a plurality of semiconductor elements and having one heat pipe per semiconductor element.

In FIG. 1 the semiconductor element consists of the semiconductor wafer 1 and of the capsule formed by the metal lids 2, 3 and the ceramic ring 4. On both sides of the element the end surfaces of the heat pipes 5, 6 are pressed. The pressure is effected by bolts 9, 10 which are applied in holes in flanges 7, 8 and press against the heat pipes. Since the operating voltage of the element is between pipes 5 and 6 the device must be arranged so that the bolts do not short-circuit the element. This can be done in a conventional manner, not shown, for example by using insulating washers.

The heat pipes 5, 6 are bent 90° and cooling bodies 11, 12 are applied on the parts facing away from the element, for example they may be shrunk onto the pipes. Each cooling body is provided with a number of cooling flanges and may be made of aluminum, some light metal alloy or copper. The cooling bodies are provided with counter electrodes 13, 14 to which connection cables for the load current may be connected. Between the cooling bodies 11 and 12 a plate 15 of insulating material is applied. In order to make the system of cooling bodies, heat pipes and semiconductor element sufficiently rigid, the outermost cooling flanges are provided with ears 16, 17, a bolt 18 acting on them and pressing the cooling bodies against the disc 15. To prevent the bolt 18 from short-circuiting the operating voltage, it is suitably provided with insulating washers (not shown) in the same way as the bolts 9, 10. A cooling air shaft has three walls 19, suitably made of insulating material. Alternatively the walls may be made of metal but then they must be lined on the inside with insulating material or be provided with insulating rails, etc. in such a way that the cooling bodies 11, 12 do not come into contact with the metal walls as this would cause the load voltage to be short-circuited through the walls of the shaft.

The finished assembly unit consisting of cooling bodies, heat pipes and semiconductor element is inserted from the side (from the top in FIG. 1) and fixed in the cooling air shaft, the fourth wall of which is thus formed by the cooling flanges 11′, 11″, 12′, 12″. Sealing strips may be arranged between the flanges 11″, 12″ and the walls of the cooling air shaft in order to prevent the cooling air from leaking out of the shaft and into the space where the semiconductor element is applied.

If necessary, the cooling air shaft may be made elongated (in a direction perpendicular to the plane of the paper in FIG. 1) and an arbitrary number of semiconductor elements with cooling bodies and heat pipes can be positioned one after the other in the longitudinal direction of the shaft. An air current is made to flow in the shaft, suitably with the help of a fan. When several semiconductor elements are placed successively, the air current may be arranged to flow in one direction in one half of the shaft (for example past the cooling body 11) and back through the other half (past the cooling body 12). In this way all the semiconductor elements are cooled equally well.

Of course, several cooling air shafts may be placed side by side in a suitable manner, or two or more semiconductor elements with cooling bodies may be placed beside each other in the same shaft.

To prevent the heat pipes and cooling bodies from being electrically charged, electrically insulating plates of a material having good thermal conductivity, for example beryllium oxide, may be positioned between the semiconductor element and one or both heat pipes. These must then be provided with special connections for the operating current. With this embodiment no precautions need be taken to electrically insulate the heat pipes and cooling bodies from each other.

As can be seen from the drawings and the description, the flow of cooling air is completely separated from the space in which the semiconductor element is located. Particles of dust, snow, water, etc. in the cooling air cannot therefore decrease the dielectric strength of the element. The insulating disc 15 prevents sparkover between the cooling bodies.

Figure 2:
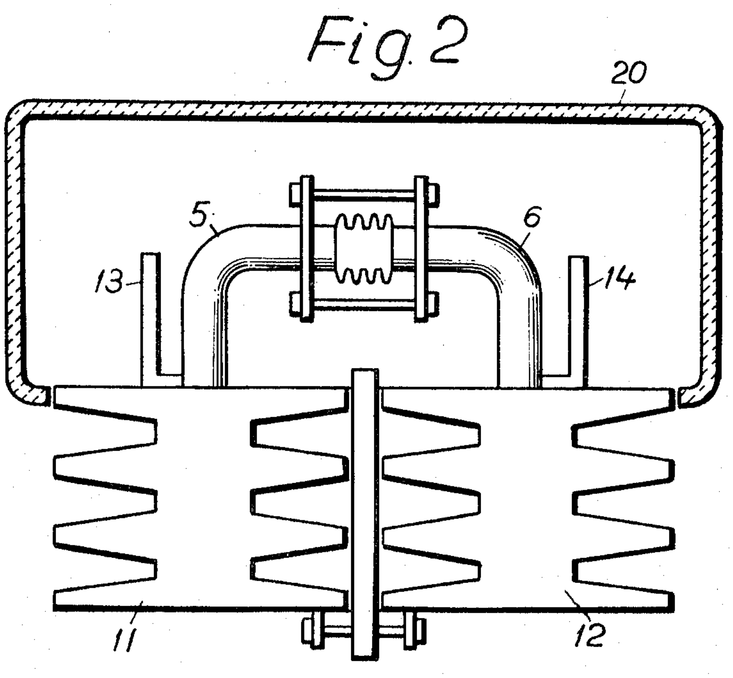

FIG. 2 shows an embodiment in which the semiconductor element and adjacent parts of the heat pipes 5, 6 are positioned inside a box or shaft 20 made of insulating material or provided with insulating parts to avoid short-circuiting. The cooling bodies are outside the box and are cooled by auto-convection or, in the case of a vehicle, by the wind caused by the speed of the vehicle.

Figure 3:
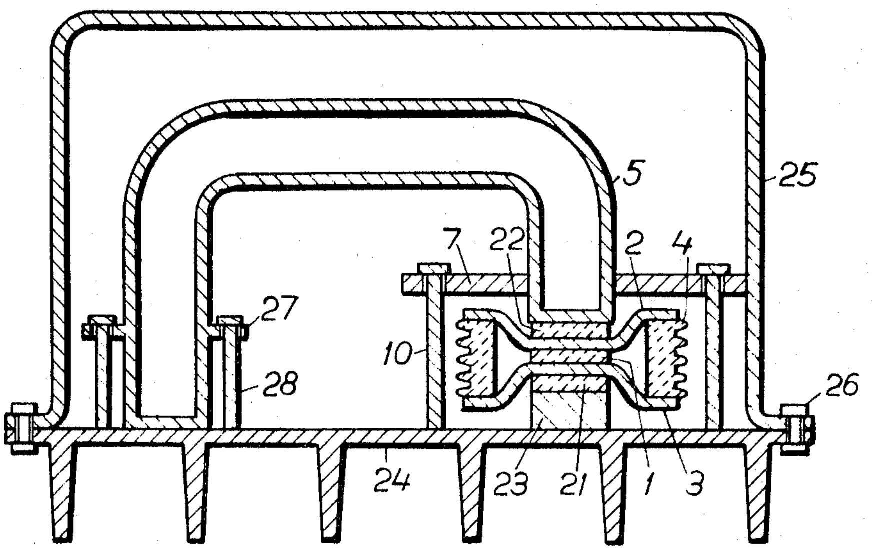
FIG. 3 shows a semiconductor element having a cooling structure similar to that shown in FIG. 1.

FIG. 3 shows a semiconductor element (1 – 4) similar to that shown in FIG. 1. On both sides of the element are insulating discs 21, 22 of beryllium oxide and members, not shown, may be placed between these discs and the element to connect cables for the load current. A heat pipe 5 provided with two 90° bends lies against the disc 22 and the disc 21 is adjacent a copper sphere 23. The heat pipe is provided with a flange 7. A metal box 25 has a lid 24 attached with the help of bolts 26. Bolts 10 are arranged in connection with the flange 7 to press the heat pipe against the lid 24 with such force that a good pressure contact is obtained between the units located between the lid and the heat pipe. At the end of the heat pipe furthest from the semiconductor element is a flange 27 and bolts 28 are arranged to press the heat pipe through this flange against the lid 24. The latter has cooling flanges to transmit the heat loss from the semiconductor element to a coolant.

In assembled condition the box 25 is completely closed and tight and can be used under extremely difficult environmental conditions without jeopardizing the dielectric strength of the semiconductor element. It can be fitted, for example, under an electrically driven railway vehicle, this often being a suitable location from the point of view of weight and space, without risk of decreased operational reliability in spite of the considerable quantities of dirt, snow, water, etc. occurring there.

Alternatively, the lid 24 may be applied in contact with a cooling liquid and possibly be designed with closed channels for a flow of coolant.

The device is of course suitable for cooling diodes as well as thyristors and other semiconductor elements.

We claim:

1. Semiconductor device comprising a semiconductor element for double-sided cooling, heat exchanging means in thermal connection with the semiconductor element in order to transmit heat therefrom to a coolant which is in contact with the heat exchanging means, the heat exchanging means forming at least part of a wall separating a space for the coolant from a space for the semiconductor element, two hollow heat pipes in contact with opposing surfaces of the semiconductor element, each heat pipe having a first part at one end surrounded by said heat exchanging means, an intermediate part projecting from the heat exchanging means into the space for the semiconductor element and, at the opposite end, a second part bent at an angle to said intermediate part so as to bring the end surface of the heat pipe into contact with one of said opposing surfaces of the semiconductor element, including means to exert a pressure on the heat pipes on both sides of the semiconductor element directed against the element.

2. Semiconductor device according to claim 1, the first and intermediate parts of one heat pipe being substantially parallel to the first and intermediate parts of the other heat pipe, said angle being substantially a right angle.

3. Semiconductor device according to claim 1, said heat exchanging means comprising a separate heat exchanger for each heat pipe.

4. Semiconductor device according to claim 1, including wall means forming a closed space in which the semiconductor element is enclosed, said heat exchanging means constituting at least part of one wall of the wall means.

5. Semiconductor device according to claim 1, including wall means forming a closed channel for the coolant, said heat exchanging means constituting at least part of one wall of the wall means.

* * * * *